(12) United States Patent
Huang et al.

(10) Patent No.: US 12,211,871 B2
(45) Date of Patent: Jan. 28, 2025

(54) IMAGE SENSOR WITH SCATTERING STRUCTURE

(71) Applicant: Taiwan Semiconductor Manufacturing Co., Ltd., Hsin-Chu (TW)

(72) Inventors: Cheng Yu Huang, Hsinchu (TW); Chun-Hao Chuang, Hsinchu (TW); Keng-Yu Chou, Kaohsiung (TW); Wei-Chieh Chiang, Yuanlin Township (TW); Wen-Hau Wu, New Taipei (TW); Chih-Kung Chang, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 495 days.

(21) Appl. No.: 17/205,158

(22) Filed: Mar. 18, 2021

(65) Prior Publication Data

US 2022/0302194 A1 Sep. 22, 2022

(51) Int. Cl.
*H01L 27/146* (2006.01)
*H01L 31/107* (2006.01)

(52) U.S. Cl.
CPC .. *H01L 27/14625* (2013.01); *H01L 27/14621* (2013.01); *H01L 27/14627* (2013.01);
(Continued)

(58) Field of Classification Search
CPC ......... H01L 27/14625; H01L 27/14621; H01L 27/14627; H01L 27/1463; H01L 27/14645;
(Continued)

(56) References Cited

U.S. PATENT DOCUMENTS

2018/0286895 A1 10/2018 Watanabe et al.
2019/0296070 A1 9/2019 Jin et al.
(Continued)

OTHER PUBLICATIONS

H. H. Li, Journal of Physical and Chemical Reference Data 9, 561, (1980), p. 569 (Year: 1980).*
(Continued)

*Primary Examiner* — Meiya Li
(74) *Attorney, Agent, or Firm* — Eschweiler & Potashnik, LLC

(57) ABSTRACT

The present disclosure relates to an integrated chip including a substrate and a pixel. The pixel includes a photodetector. The photodetector is in the substrate. The integrated chip further includes a first inner trench isolation structure and an outer trench isolation structure that extend into the substrate. The first inner trench isolation structure laterally surrounds the photodetector in a first closed loop. The outer trench isolation structure laterally surrounds the first inner trench isolation structure along a boundary of the pixel in a second closed loop and is laterally separated from the first inner trench isolation structure. Further, the integrated chip includes a scattering structure that is defined, at least in part, by the first inner trench isolation structure and that is configured to increase an angle at which radiation impinges on the outer trench isolation structure.

20 Claims, 18 Drawing Sheets

(52) U.S. Cl.
CPC .... *H01L 27/1463* (2013.01); *H01L 27/14645* (2013.01); *H01L 27/14685* (2013.01); *H01L 31/107* (2013.01)

(58) Field of Classification Search
CPC ............. H01L 27/14685; H01L 31/107; H01L 21/76224; H01L 31/02327
See application file for complete search history.

(56) References Cited

U.S. PATENT DOCUMENTS

| | | | |
|---|---|---|---|
| 2020/0219910 A1* | 7/2020 | Shim | H01L 27/14689 |
| 2021/0013250 A1* | 1/2021 | Shim | H01L 27/14609 |
| 2021/0035926 A1* | 2/2021 | Liu | H01L 27/1463 |
| 2021/0313371 A1* | 10/2021 | Yoo | H01L 27/1463 |

OTHER PUBLICATIONS

Hang Hu, Journal of Applied Physics 94, 551 (2003), p. 554 (Year: 2003).*
Franco Zappa et al., Principles and features of single-photon avalanche diode arrays, Sensors and Actuators, Jun. 26, 2007 (Year: 2007).*
Bude et al. "Hot-Carrier Luminescence in Si." Physical review. B, Condensed matter • Apr. 1992.
Finkelstein et al. "Analysis of Hot-Carrier Luminescence for Infrared Single-Photon Upconversion and Readout." IEEE Journal of Selected Topics in Quantum Electronics, 13(4), published Jul. 1, 2007.

* cited by examiner

IMAGE SENSOR WITH SCATTERING STRUCTURE

BACKGROUND

Integrated circuits (ICs) with complementary metal-oxide-semiconductor (CMOS) image sensors are used in a wide range of modern-day electronic devices, such as, for example, cameras and cell phones. Some CMOS image sensors are based on avalanche photodiodes (APD) and single-photon avalanche photodiodes (SPAD).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
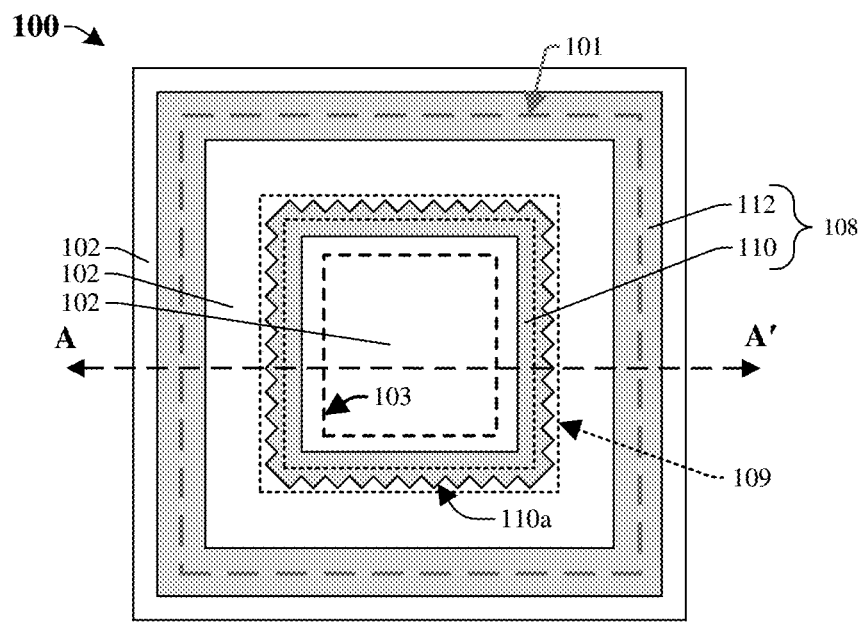
FIG. 1A illustrates a top layout view of some embodiments of an integrated chip including an image sensor in which a first inner trench isolation structure defines a scattering structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip includes an image sensor. The image sensor comprises a pixel disposed along a substrate. The pixel comprises a photodetector in the substrate and a deep trench isolation (DTI) structure surrounding the photodetector along a boundary of the pixel. When photons enter the pixel, the photons may be absorbed by the photodetector, thereby creating electron-hole pairs and transferring kinetic energy from the photons to carriers of the electron-hole pairs. Some photodetectors operate in a reverse biased state with a high bias voltage and thus exhibit a strong electric field. Such photodetectors include avalanche photodiodes (APD), single-photon avalanche diodes (SPADs), and other suitable photodiodes. Because of the strong electric field, the carriers may gain a relatively high kinetic energy from being accelerated by the strong electric field. Carriers having high kinetic energy may be referred to as "hot carriers." In some instances, a hot electron recombines with a hole and emits any excess energy as one or more photons. This phenomenon may be referred to as "hot-carrier luminescence." Photons produced by hot-carrier luminescence may be emitted outward in any direction and may hence travel from the photodetector toward the DTI structure at a number of different angles.

In many image sensors, the DTI structure comprises silicon dioxide and the substrate comprises silicon. An interface between the silicon dioxide of the DTI structure and the silicon of the substrate reflects some incident photons back towards the photodetector by total internal reflection (TIR), thereby reducing cross talk and improving performance of the photodetector. However, TIR depends upon the photons impinging on the interface with incident angles that are greater than a critical angle (e.g., about 20 degrees or some other suitable value). Because photons produced by hot-carrier luminescence may be emitted outward in any direction, many photons may impinge on the interface at an angle that is less than the critical angle and may hence pass through the DTI structure. As a result, crosstalk between pixels may be high. Further, quantum efficiency (QE) and other suitable performance metrics for the image sensor may be low.

Various embodiments of the present disclosure are related to an integrated chip including an image sensor in which a scattering structure reduces crosstalk and improves performance of the image sensor. The image sensor includes a pixel disposed along a substrate. The pixel comprises a photodetector in the substrate. A first inner trench isolation structure and an outer trench isolation structure extend into the substrate. The first inner trench isolation structure laterally surrounds the photodetector in a first closed loop, and the outer trench isolation structure laterally surrounds the first inner trench isolation structure along a boundary of the pixel in a second closed loop. Further, the first inner trench isolation structure is laterally separated from the outer trench isolation structure and has a plurality of outer sidewalls defining a scattering structure that is configured to increase an angle at which photons impinge on the outer trench isolation structure.

By including the scattering structure in the image sensor, an angle at which photons (e.g., photons that are produced by hot-carrier luminescence) impinge on the outer trench isolation structure may be increased. For example, the photons may impinge on the first inner trench isolation structure at an angle that is less than a critical angle for TIR. Thus, the photons may pass through the first inner trench isolation structure. When exiting the first inner trench isolation structure, the scattering structure may refract the photons and change the direction in which the photons are traveling. As a result, the photons may impinge on the outer trench isolation structure at an angle that is greater than a critical angle for TIR. Thus, the photons may be reflected back towards the photodetector, thereby preventing the photons from exiting the pixel and entering neighboring pixels. As a result, crosstalk between the pixel and neighboring pixels may be reduced, thereby improving a performance of the image sensor.

Further, due to the reflection of the photons by the outer trench isolation structure, the photons may have an increased chance of being absorbed by the substrate between the first inner trench isolation structure and the outer trench isolation structure. Thus, the photons may have a decreased chance of exiting the pixel and entering neighboring pixels. As a result, crosstalk may be further reduced and hence a performance of the image sensor may be further improved.

FIG. 1A illustrates a top layout view 100 of some embodiments of an integrated chip including an image sensor, the image sensor comprising a first inner trench isolation structure 110 and an outer trench isolation structure 112 in which the first inner trench isolation structure 110 defines a scattering structure 109.

In such embodiments, the image sensor comprises a pixel 101 disposed along a substrate 102. The pixel 101 comprises a photodetector 103 in the substrate 102. The image sensor further comprises a multi-trench isolation structure 108. The multi-trench isolation structure 108 comprises the first inner trench isolation structure 110 and an outer trench isolation structure 112. The first inner trench isolation structure 110 surrounds the photodetector 103 in a first closed loop. The outer trench isolation structure 112 surrounds the first inner trench isolation structure 110 along a boundary of the pixel 101 in a second closed loop different from the first closed loop. The first inner trench isolation structure 110 and the outer trench isolation structure 112 are continuous along the first closed loop and the second closed loop, respectively. Further, the outer trench isolation structure 112 is laterally separated from the first inner trench isolation structure 110 by the substrate 102.

In some embodiments, the first inner trench isolation structure 110 has a pair of segments (not labeled) respectively on opposite sides of the photodetector 103 and the outer trench isolation structure 112 also has a pair of segments (not labeled) respectively on opposite sides of the photodetector 103.

The first inner trench isolation structure 110 comprises a plurality of outer sidewalls 110a (e.g., sidewalls facing the outer trench isolation structure 112) that define the scattering structure 109. The plurality of outer sidewalls 110a that define the scattering structure 109 are angled relative to neighboring inner sidewalls (e.g., sidewalls facing the first inner trench isolation structure 110) of the outer trench isolation structure 112. In some embodiments, the plurality of outer sidewalls 110a that define the scattering structure 109 have a first periodic pattern. The first inner trench isolation structure 110 further comprises a plurality of inner sidewalls (e.g., sidewalls facing the photodetector 103) and, in some embodiments, the inner sidewalls of the first inner trench isolation structure 110 are devoid of the first periodic pattern (e.g., are flat).

The first inner trench isolation structure 110 has a first width that varies throughout the first closed path along an outer perimeter of the first inner trench isolation structure 110, whereas the outer trench isolation structure 112 has a second width that is uniform or substantially uniform throughout the second closed path.

By including the scattering structure 109 in the image sensor, an angle at which photons (e.g., photons produced by hot-carrier luminescence) impinge on the outer trench isolation structure 112 may be increased. For example, photons may pass though the scattering structure 109 and the scattering structure 109 may change the direction in which the photons are traveling. As a result, the photons may impinge on the outer trench isolation structure 112 at an angle that is greater than a critical angle for TIR. Thus, the photons may be reflected back towards the photodetector 103, thereby preventing the photons from exiting the pixel 101 and entering neighboring pixels. As a result, crosstalk between the pixel 101 and neighboring pixels may be reduced, thereby improving a performance of the image sensor.

Further, due to the reflection of the photons by the outer trench isolation structure 112, the photons may remain in the substrate 102 for a longer period of time and hence may have an increased chance of being absorbed by the substrate 102 between the first inner trench isolation structure 110 and the outer trench isolation structure 112. As a result, a performance of the image sensor may be further improved.

The multi-trench isolation structure 108 comprises a dielectric. For example, the multi-trench isolation structure 108 may comprise silicon dioxide, silicon nitride, silicon oxynitride, silicon carbide, aluminum oxide, titanium oxide, zinc oxide, some other dielectric, or any combination of the foregoing. The substrate 102 may, for example, comprise silicon, some other semiconductor, or the like. The photodetector 103 may, for example, be or comprise a photodiode, an APD, a SPAD, some other photodetector, or the like. In some embodiments, the multi-trench isolation structure 108 and the substrate 102 directly contact at an interface, and the multi-trench isolation structure 108 and the substrate 102 respectively have a low refractive and a high refractive index (comparatively) at the interface, to promote total internal reflection at the interface.

Figure 1B:
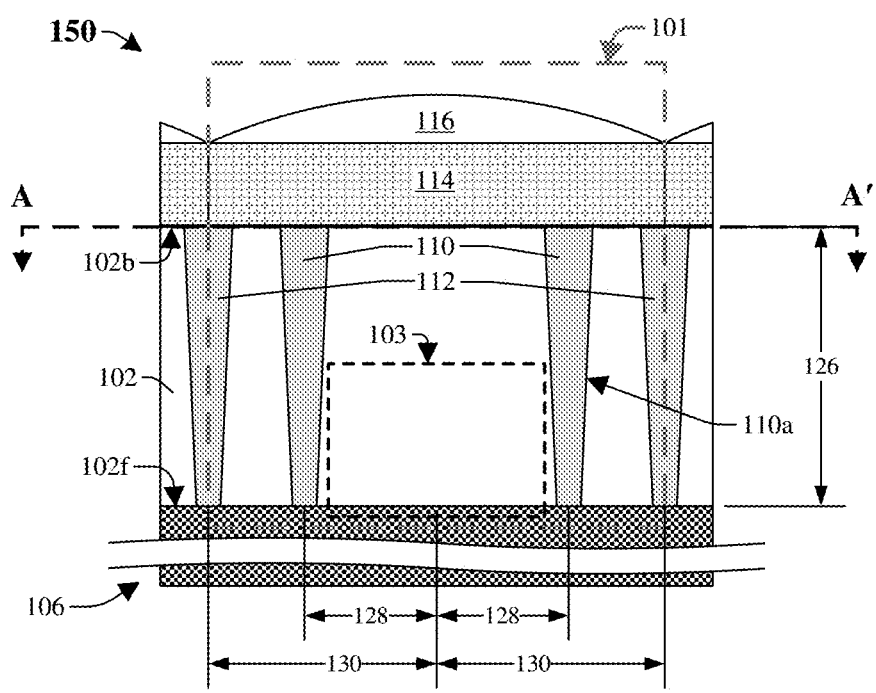
FIG. 1B illustrates a cross-sectional view of some embodiments of the integrated chip of FIG. 1A.

FIG. 1B illustrates a cross-sectional view 150 of some embodiments of the integrated chip of FIG. 1A. The cross-sectional view 150 may, for example, be taken across line A-A' in FIG. 1A. Alternatively, in some embodiments, the cross-sectional view 150 may, for example, be take across like A-A' of any of FIGS. 2A-2E.

In such embodiments, the first inner trench isolation structure 110 and the outer trench isolation structure 112 extend into the substrate 102 from a back-side 102b of the substrate 102 to a front-side 102f of the substrate 102 that is opposite the back-side 102b. The first inner trench isolation structure 110 and the outer trench isolation structure 112 extend into the substrate 102 to a depth 126 that is approximately equal to a thickness to the substrate 102 (e.g., the first inner trench isolation structure 110 and the outer trench isolation structure 112 may extend through the substrate 102). Further, widths of top surfaces of the first inner trench isolation structure 110 and the outer trench isolation structure 112 are greater than widths of bottom surfaces of the first inner trench isolation structure 110 and the outer trench isolation structure 112, respectively.

The first inner trench isolation structure 110 laterally surrounds the photodetector 103 at a first distance 128. Further, the outer trench isolation structure 112 laterally surrounds the photodetector 103 at a second distance 130 that is greater than the first distance 128.

In addition, the image sensor comprises an interconnect structure 106 disposed along the front-side 102f of the substrate 102. In some embodiments, the image sensor may further comprise a color filter 114 along the back-side 102b of the substrate 102 and a micro-lens 116 over the color filter 114, through which photons may enter the pixel 101.

FIGS. 2A-2E illustrate top layout views 210-250 of some alternative embodiments of the integrated chip of FIG. 1A and/or FIG. 1B in which the first inner trench isolation structure 110 that defines the scattering structure 109 is varied.

Figure 2A:
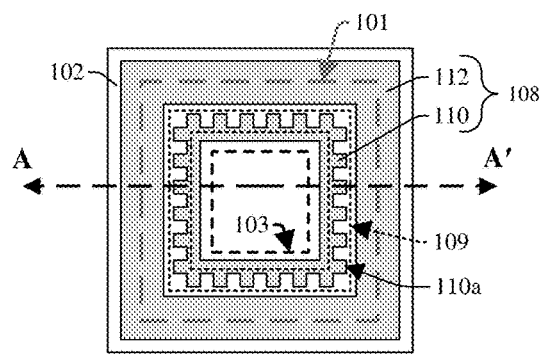
FIGS. 2A-2E illustrate top layout views of some alternative embodiments of the integrated chip of FIG. 1A and/or FIG. 1B in which the first inner trench isolation structure is varied.
Figure 2B:
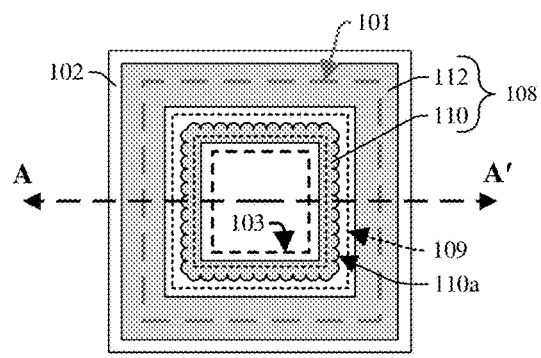
Figure 2C:
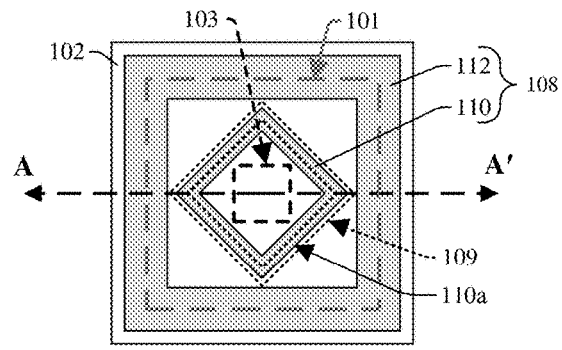
Figure 2D:
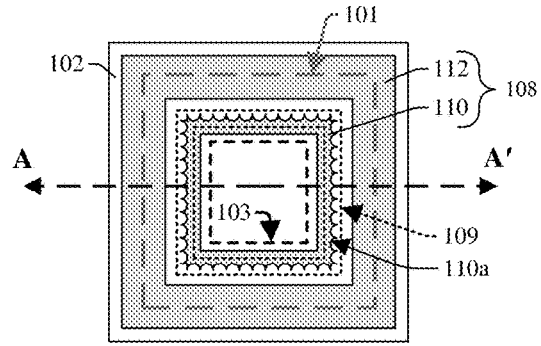

In the embodiments of FIGS. 2A, 2B, and 2D, the outer sidewalls 110a of the first inner trench isolation structure 110 each have a periodic pattern. In FIG. 2A, the outer sidewalls 110a of the first inner trench isolation structure 110 have a periodic of pattern of square or rectangular shaped protrusions. In FIG. 2B, the outer sidewalls 110a of the first inner trench isolation structure 110 have a periodic pattern of curved bumps. This may, for example, also be known as a scalloped pattern. In FIG. 2D, the outer sidewalls 110a of the first inner trench isolation structure 110 have a periodic pattern of curved recessed. Additionally, in the embodiments of FIGS. 2A, 2B, and 2D, the first inner trench isolation structures 110 each have widths that vary along the outer perimeter of the first inner trench isolation structures 110.

In the embodiments of FIG. 2C, the first inner trench isolation structure 110 may have a diamond-shaped top layout. Thus, the outer sidewalls 110a of the first inner trench isolation structure 110 that define the scattering structure 109 are each at a non-zero angle relative to the inner sidewalls of the outer trench isolation structure 112.

Figure 2E:
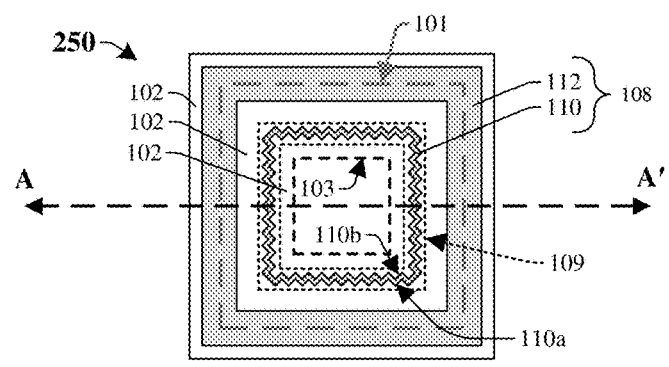

In the embodiments of FIG. 2E, the first inner trench isolation structure 110 comprises a plurality of inner sidewalls 110b having a periodic pattern.

In such embodiments, the inner sidewalls 110b of the first inner trench isolation structure 110 (e.g. the sidewalls that face the photodetector 103) have a periodic pattern and further define the scattering structure 109. In some embodiments, the inner sidewalls of the first inner trench isolation structure 110 have a pattern similar to that of the outer sidewalls 110a of the first inner trench isolation structure 110.

Due to the inner sidewalls 110b of the first inner trench isolation structure 110 that have a periodic pattern and that further define the scattering structure 109, some photons may be reflected by the first inner trench isolation structure 110 back toward the photodetector 103 while some other photons may pass through the first inner trench isolation structure 110, may be scattered by the first inner trench isolation structure 110, and may be reflected by the outer trench isolation structure 112. For example, some photons may impinge on the first inner trench isolation structure 110 at an angle that is greater than a critical angle for TIR, while some other photons may impinge on the first inner trench isolation structure at an angle that is less than the critical angle. Thus, some photons may be reflected by the first inner trench isolation structure 110 while some other photons may pass through the first inner trench isolation structure 110 and may experience scattering when exiting the first inner trench isolation structure 110.

Figure 3A:
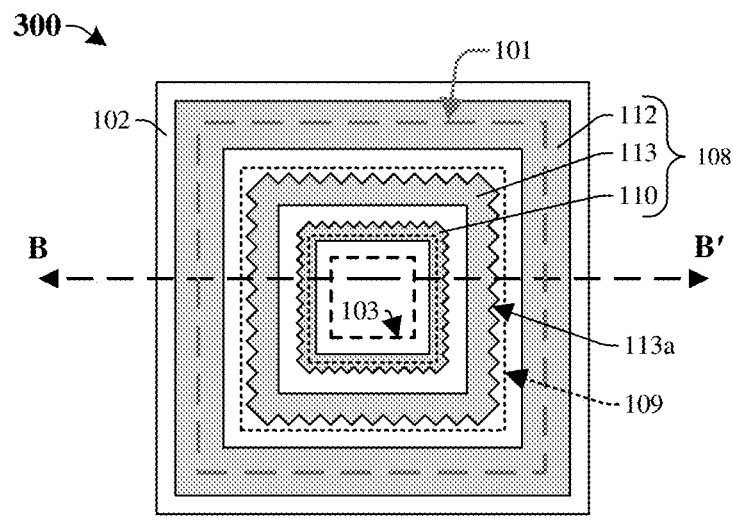
FIG. 3A illustrates a top layout view of some alternative embodiments of the integrated chip of FIG. 1A in which a second inner trench isolation structure further defines the scattering structure.
Figure 3B:
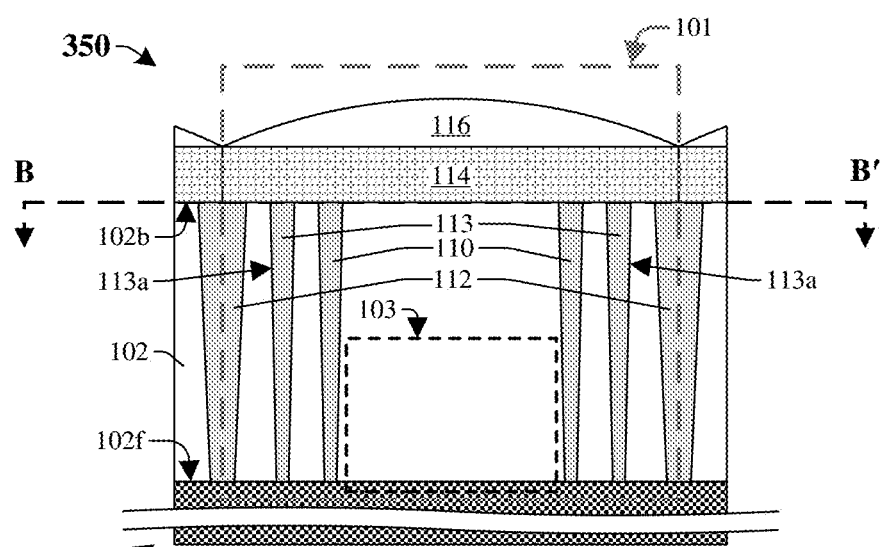
FIG. 3B illustrates a cross-sectional view of some embodiments of the integrated chip of FIG. 3A.

Referring to FIGS. 3A and 3B simultaneously, FIG. 3A illustrates a top layout view 300 of some alternative embodiments of the integrated chip of FIG. 1A in which a second inner trench isolation structure 113 further defines the scattering structure 109, while FIG. 3B illustrates a cross-sectional view 350 of some embodiments of the integrated chip of FIG. 3A. The cross-sectional view 350 may, for example, be taken across line B-B' of FIG. 3A. Alternatively, in some embodiments, the cross-sectional view 350 may, for example, be take across like B-B' of FIG. 4A or 4B.

In such embodiments, the multi-trench isolation structure 108 further comprises a second inner trench isolation structure 113. The second inner trench isolation structure 113 laterally surrounds the first inner trench isolation structure 110 along a third closed path different from the first closed path (e.g., of the first inner trench isolation structure 110) and the second closed path (e.g., of the outer trench isolation structure 112). Further, the second inner trench isolation structure 113 is laterally surrounded by the outer trench isolation structure 112 and is laterally separated from the first inner trench isolation structure 110 and from the outer trench isolation structure 112 by the substrate 102.

In some embodiments, the second inner trench isolation structure 113 comprises a plurality of outer sidewalls 113a (e.g., sidewalls facing the outer trench isolation structure 112) that have a periodic pattern. The plurality of outer sidewalls 113a of the second inner trench isolation structure 113 further define the scattering structure 109.

By including the second inner trench isolation structure 113 in the multi-trench isolation structure 108, photons traveling towards the multi-trench isolation structure 108 from the photodetector 103 (e.g., photons produced by hot-carrier luminescence) may experience increased scattering and thus may be less likely to enter neighboring pixels. As a result, crosstalk may be reduced.

Figure 4A:
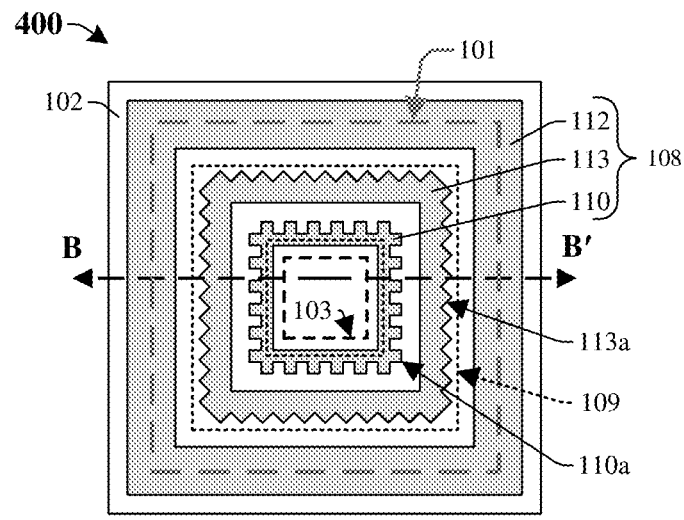
FIGS. 4A and 4B illustrate top layout views of some alternative embodiments of the integrated chip of FIG. 3A and/or FIG. 3B in which the first and second inner trench isolation structures are varied.
Figure 4B:
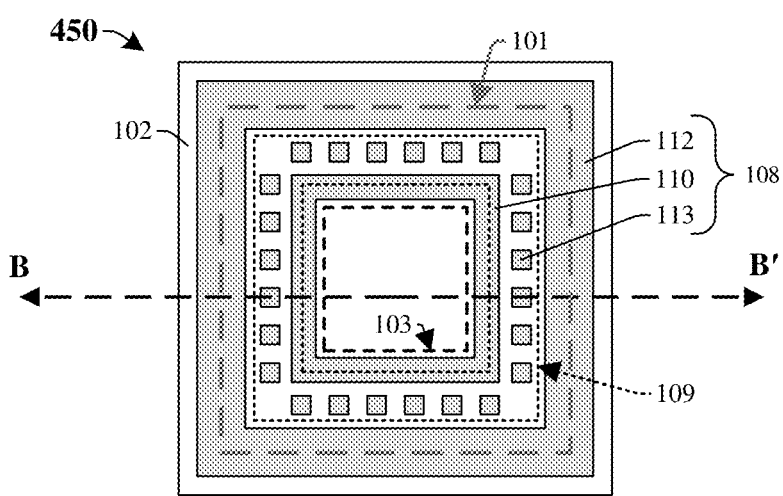

FIGS. 4A and 4B illustrate top layout views 400 and 450 of some alternative embodiments of the integrated chip of FIG. 3A and/or FIG. 3B in which the first inner trench isolation structure 110 and the second inner trench isolation structure 113 are varied.

In the embodiments of FIG. 4A, outer sidewalls 110a of the first inner trench isolation structure 110 have a periodic of pattern of square or rectangular shaped protrusions. Further, outer sidewalls 113a of the second inner trench isolation structure 113 a sawtooth shaped periodic pattern. Other shapes, however, are also feasible.

In the embodiments of FIG. 4B, the second inner trench isolation structure 113 includes a plurality of discrete segments spaced along the third closed path. The segments are separated from one another by the substrate 102. Other shapes, however, are also feasible.

Figure 5:
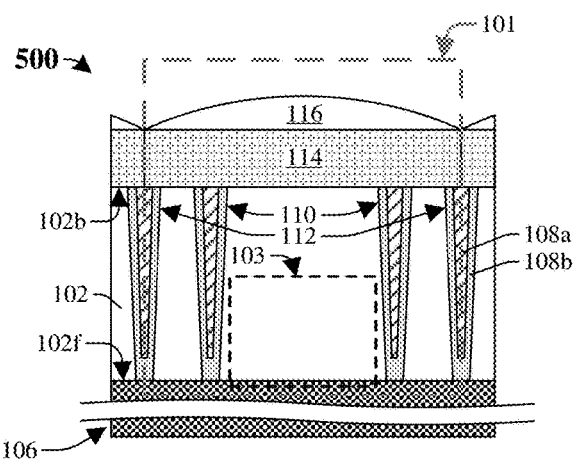
FIG. 5 illustrates a cross-sectional view of some alternative embodiments of the integrated chip of FIG. 1B in which the first inner trench isolation structure and the outer trench isolation structure comprise a plurality of layers.

FIG. 5 illustrates a cross-sectional view 500 of some alternative embodiments of the integrated chip of FIG. 1B in which the first inner trench isolation structure 110 and the outer trench isolation structure 112 comprise a plurality of layers.

In such embodiments, the first inner trench isolation structure 110 and the outer trench isolation structure 112 comprise a first isolation layer 108a and a second isolation layer 108b disposed along sidewalls and lower surfaces of the first isolation layer 108a. Further, the second isolation layer 108b laterally surrounds the first isolation layer 108a.

The first isolation layer 108a comprises a metal. For example, the first isolation layer 108a may comprise tungsten, copper, aluminum, titanium, tantalum, or the like. In addition, the second isolation layer 108b comprises a dielectric. For example, the second isolation layer 108b may comprise silicon oxide, silicon nitride, aluminum oxide, aluminum nitride, some other dielectric, or the like.

Figure 6A:
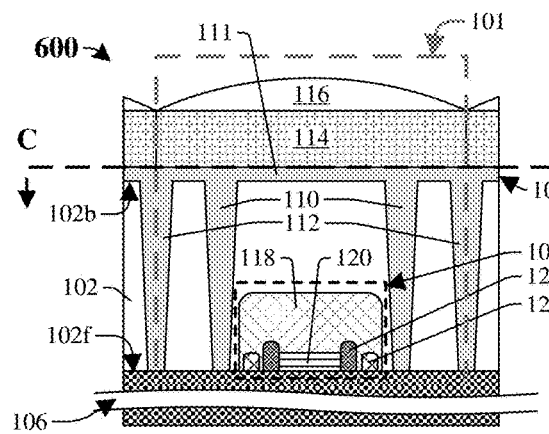
FIG. 6A illustrates a cross-sectional view of some alternative embodiments of the integrated chip of FIG. 1B in which the image sensor comprises a semiconductor well and a guard ring.
Figure 6B:
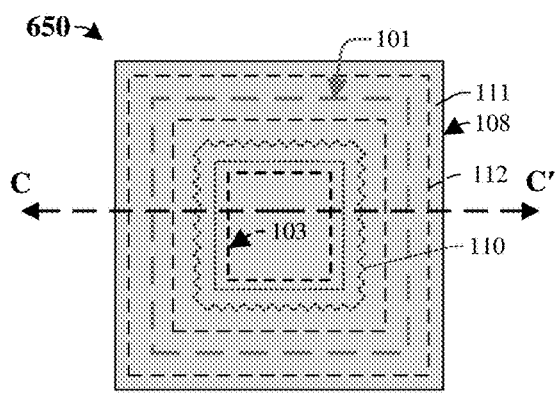
FIG. 6B illustrates a top layout view of some embodiments of the integrated chip of FIG. 6A.

Referring to FIGS. 6A and 6B simultaneously, FIG. 6A illustrates a cross-sectional view 600 of some alternative embodiments of the integrated chip of FIG. 1B in which the image sensor comprises a semiconductor well 118 and a guard ring 122, while FIG. 6B illustrates a top layout view 650 of some embodiments of the integrated chip of FIG. 6A. The cross-sectional view 600 of FIG. 6A may, for example, be taken across line C-C' of FIG. 6B.

In such embodiments, the photodetector 103 includes the semiconductor well 118. The semiconductor well 118 is a doped region of the substrate 102 having a doping type opposite that of the substrate 102. Further, the photodetector 103 includes a first semiconductor region 120. The guard ring 122 is disposed along sidewalls of the first semiconductor region 120 such that the guard ring 122 surrounds the first semiconductor region 120 in a ring shape. The first semiconductor region 120 and the guard ring 122 have a doping type opposite that of the semiconductor well 118. In addition, the photodetector 103 may comprise contact regions 124 in the semiconductor well 118 that have a same doping type as that of the semiconductor well 118. In some instances, the first semiconductor region 120 forms a p-n junction with the semiconductor well 118. Further, any of the aforementioned features (e.g., 118, 120, 122, 124) may have similar or different doping concentrations. The photodetector 103 may, for example, be or comprise an SPAD, an APD, or some other suitable type of photodetector.

In some embodiments, the multi-trench isolation structure 108 further comprises a front cover 111 that extends over the substrate 102 and over the photodetector 103. Further, the front cover 111 extends along the substrate 102 between the first inner trench isolation structure 110 and the outer trench isolation structure 112.

Figure 7:
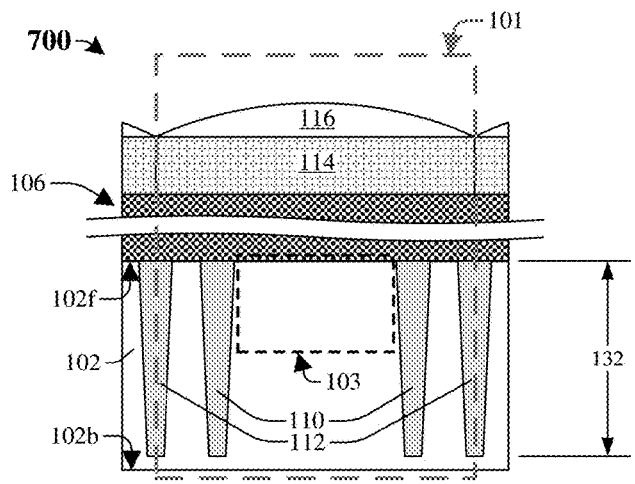
FIG. 7 illustrates a cross-sectional view of some alternative embodiments of the integrated chip of FIG. 1B in which the image sensor is front-side illuminated (FSI).

FIG. 7 illustrates a cross-sectional view 700 of some alternative embodiments of the integrated chip of FIG. 1B in which the image sensor is front-side illuminated (FSI).

In such embodiments, the first inner trench isolation structure 110 and the outer trench isolation structure 112 extend into the substrate from a front-side 102f of the substrate 102 to a depth 132 that is less than the thickness of the substrate 102 (e.g., the first inner trench isolation structure 110 and the outer trench isolation structure 112 may not extend through the substrate 102). Further, an interconnect structure 106 is disposed along the front-side 102f of the substrate. In addition, a color filter 114 may be disposed along the front-side 102f of the substrate 102 over the interconnect structure 106 and a micro-lens 116 may be disposed along the front-side 102f of the substrate 102 over the color filter 114.

Although FIG. 7 illustrates that the first inner trench isolation structure 110 and the outer trench isolation structure 112 do not extend through the substrate 102, it will be appreciated that in some embodiments, the first inner trench isolation structure 110 and the outer trench isolation structure 112 may alternatively extend through the substrate 102.

While FIG. 1B is described as being taken along line A-A' in FIG. 1A, it is to be appreciated that FIG. 1B may alternatively be taken along line A-A' in any of FIGS. 2A-2E. In alternative embodiments of FIGS. 1B, 3B, 6A, and 7, the multi-trench isolation structures 108 may include a plurality of layers as illustrated in FIG. 5. In alternative embodiments, of FIGS. 1B, 3B, 5, and 7, the photodetectors 103 may be configured as in FIGS. 6A and 6B. In alternative embodiments, of FIGS. 1B, 3B, 5, and 7, the multi-trench isolation structure 108 may cover the back-side 102b of the substrate 102 as in FIGS. 6A and 6B. In alternative embodiments of FIGS. 6A and 6B, the multi-trench isolation structure 108 may be configured as in any one or combination of FIGS. 1A, 1B, 2A-2E, 3A, 3B, 4A, 4B, 5, and 7.

FIGS. 8, 9, 10A and 10B through 13A and 13B, 14, and 15 illustrate views 800, 900, 1000 and 1050 through 1300 and 1350, 1400, and 1500 of some embodiments of a method for forming an integrated chip including a back-side illuminated (BSI) image sensor, the image sensor including a multi-trench isolation structure 108 with a scattering structure 109. Figures with a suffix of A correspond to cross-sectional views. Figures with a suffix of B correspond to top layout views for like numbered figures with a suffix of A. Figures without a suffix of A or B correspond to cross-sectional views. Although FIGS. 8, 9, 10A and 10B through 13A and 13B, 14, and 15 are described in relation to a method, it will be appreciated that the structures disclosed in FIGS. 8, 9, 10A and 10B through 16A and 13B, 14, and 15 are not limited to such a method, but instead may stand alone as structures independent of the method.

Figure 8:
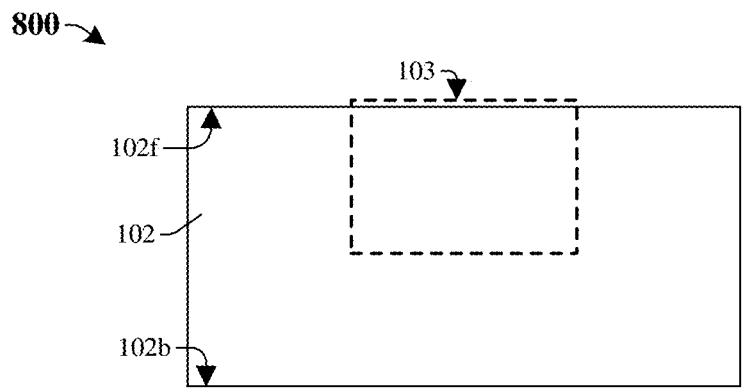
FIGS. 8, 9, 10A, 10B, 11A, 11B, 12A, 12B, 13A, 13B, 14, and 15 illustrate cross-sectional views of some embodiments of a method for forming an integrated chip including a back-side illuminated (BSI) image sensor, the image sensor including a multi-trench isolation structure with a scattering structure.

As shown in cross-sectional view 800 of FIG. 8, a photodetector 103 is formed in a substrate 102 along a front-side 102f of the substrate 102. The photodetector 103 may be formed through a number of processes such as, for example, ion implantation or the like.

Figure 9:
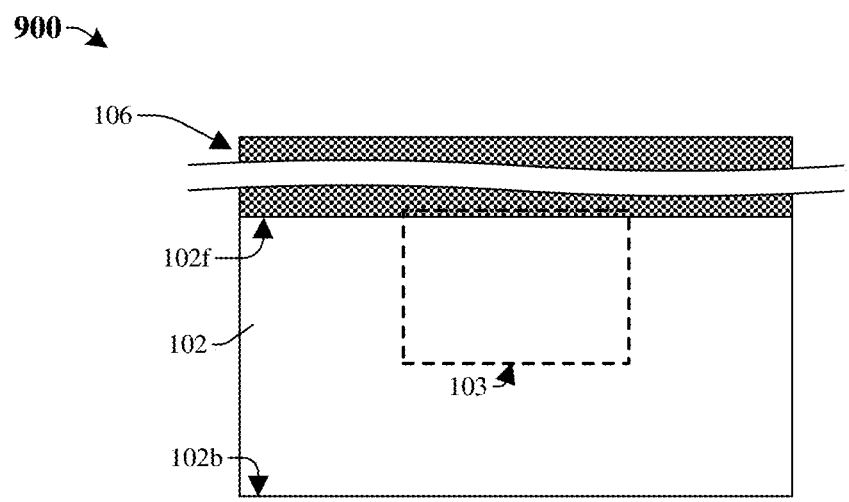

As shown in cross-sectional view 900 of FIG. 9, an interconnect structure 106 is formed over the photodetector 103 along the front-side 102f of the substrate 102. The interconnect structure 106 may, for example, comprise any of a plurality of interlayer dielectric layers, a plurality of metal lines, and a plurality of vias. The interlayer dielectric layers may, for example, be formed by chemical vapor deposition (CVD), physical vapor deposition (PVD), atomic layer deposition (ALD), a spin on process, or the like. The plurality of metal lines and/or the plurality of vias may, for example, be formed by etching the interlayer dielectric layers with a wet etching process or a dry etching process, and subsequently depositing metal by a sputtering process, an electroplating process, or the like to form the metal lines and/or vias.

Figure 10A:
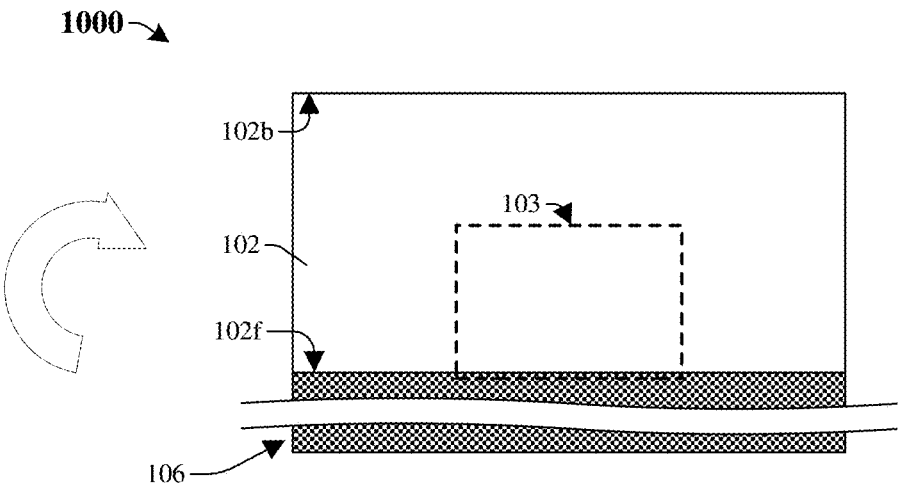
Figure 10B:
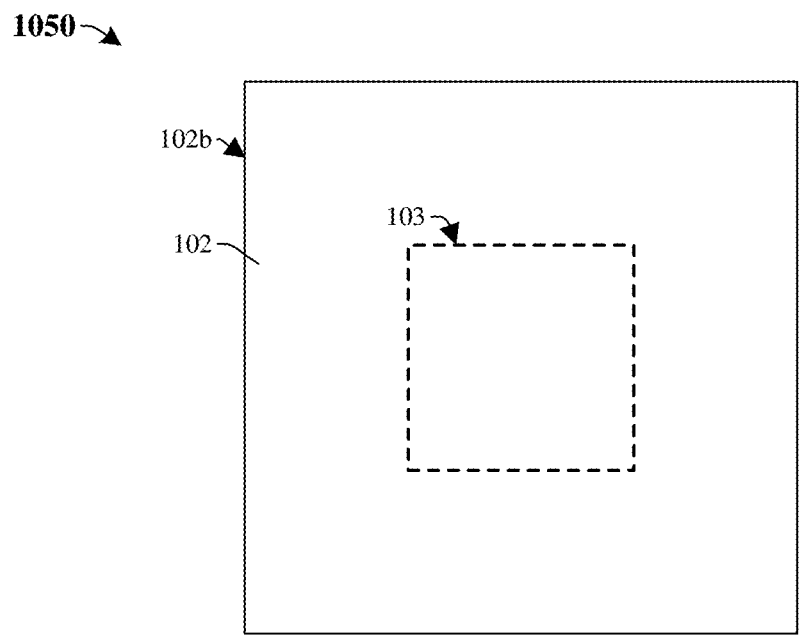

As shown in cross-sectional view 1000 of FIG. 10A and top layout view 1050 of FIG. 10B, the substrate 102 is rotated such that a back-side 102b of the substrate 102 is over the front-side 102f of the substrate 102.

Figure 11A:
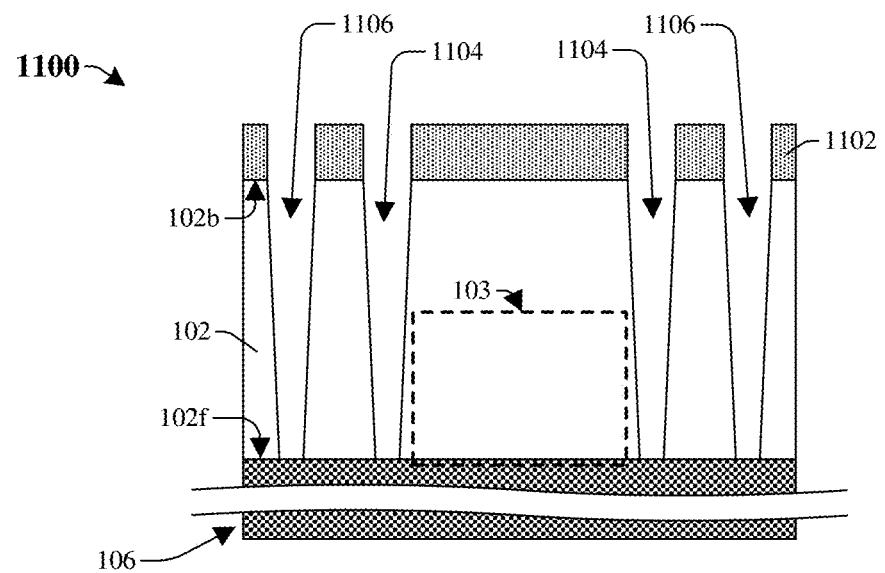
Figure 11B:
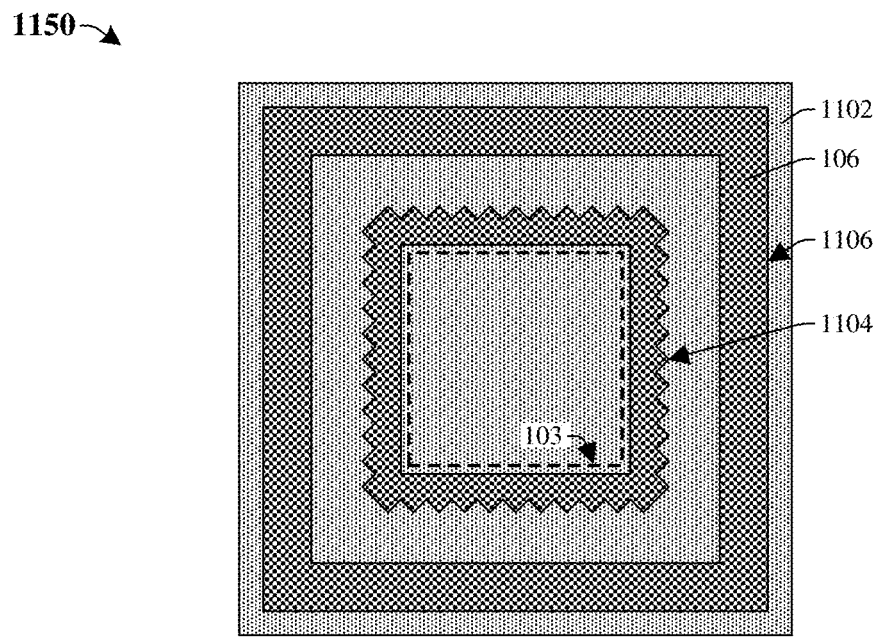

As shown in cross-sectional view 1100 of FIG. 11A and top layout view 1150 of FIG. 11B, a photoresist mask 1102 is formed over the back-side 102b of the substrate 102 and the substrate 102 is patterned with the photoresist mask 1102 in place to form a first inner trench opening 1104 and an outer trench opening 1106 that are defined by sidewalls of the substrate 102. The first inner trench opening 1104 extends through the substrate 102 and laterally surrounds the photodetector 103. The outer trench opening 1106 extends through the substrate 102 and laterally surrounds the first inner trench opening 1104. The patterning may, for example, comprise a wet etching process, a dry etching process, or the like.

In some alternative embodiments, the first inner trench opening 104 has a top layout as in any one of FIGS. 2A-2E. In some alternative embodiments, the patterning may further form a second inner trench opening (not shown) between the first inner trench opening 1104 and the outer trench opening 1106. In at least some of such alternative embodiments, the first inner trench opening 1104, the outer trench opening 1106, and the second inner trench opening may, for example, have top layouts respectively as the first inner trench isolation structure 110, the outer trench isolation structure 112, and the second inner trench isolation structure 113 in any one of FIGS. 3A, 4A, and 4B.

Figure 12A:
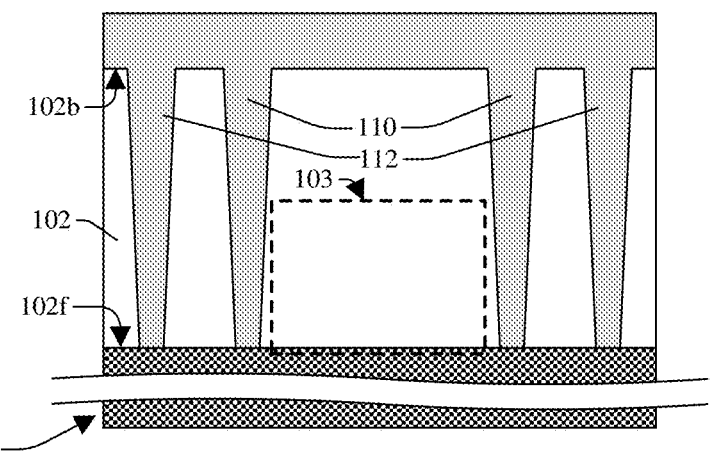
Figure 12B:
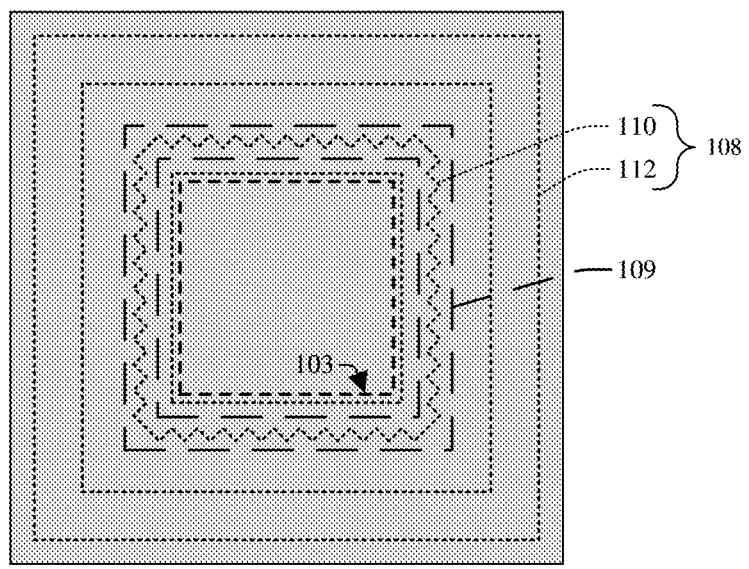

As shown in cross-sectional view 1200 of FIG. 12A and top layout view 1250 of FIG. 12B, a dielectric is deposited over the back-side 102b of the substrate 102, in the first inner trench opening 1104, and in the outer trench opening 1106 to form a multi-trench isolation structure 108. The multi-trench isolation structure 108 comprises a first inner trench isolation structure 110 that defines a scattering structure 109. The first inner trench isolation structure 110 has a plurality of outer sidewalls that are adjacent to sidewalls of the substrate 102 that defined the first inner trench opening 1104. Further, the plurality of outer sidewalls of the first inner trench isolation structure 110 define, at least in part, the scattering structure 109. The multi-trench isolation structure 108 further comprises an outer trench isolation structure 112. The dielectric may, for example, be deposited by CVD, PVD, ALD, a spin-on process, or the like.

In some embodiments, the dielectric may be further deposited in the second inner trench opening (not shown) to form a second inner trench isolation structure between the first inner trench isolation structure 110 and the outer trench isolation structure 112.

Further, in some embodiments, a metal may be deposited in any of the aforementioned trench openings to form a metal layer within any of the aforementioned trench isolation structures. See, for example, FIG. 5. For example, instead of fully filling the first inner and outer trench openings 1104, 1106, the dielectric may be deposited lining and partially filling the first inner and outer trench openings 1104, 1106. The metal may then be deposited filling a remainder of the first inner and outer trench openings 1104, 1106 over the dielectric.

Figure 13A:
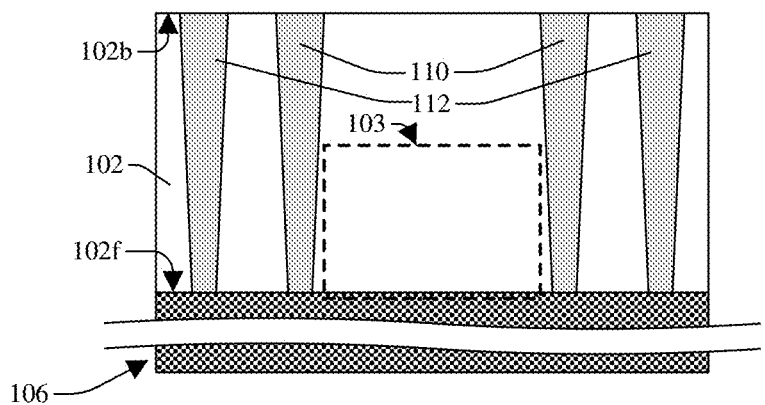
Figure 13B:
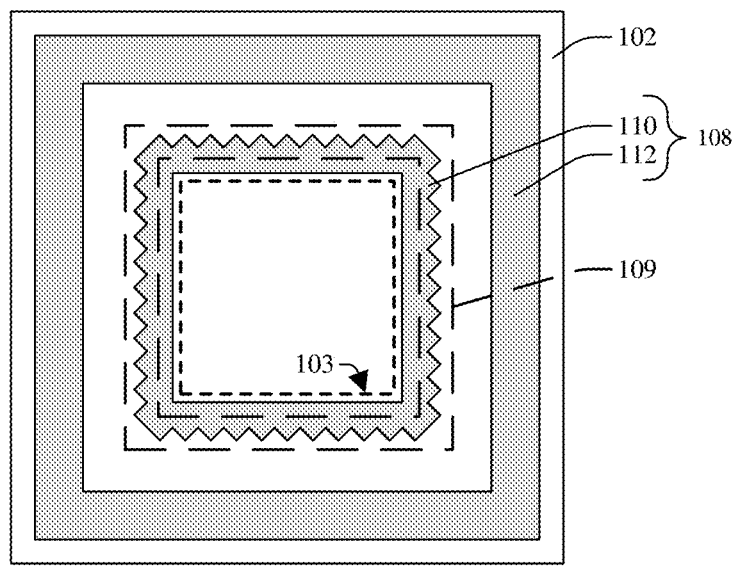

As shown in cross-sectional view 1300 of FIG. 13A and top layout view 1350 of FIG. 13B, a planarization process is performed into the dielectric to remove the dielectric from the back-side 102b of the substrate 102. The planarization process may, for example, comprise a chemical mechanical planarization (CMP) process or the like.

In some embodiments, the planarization process thins the dielectric but does not remove the dielectric from the back-side 102b of the substrate 102, such that the dielectric extends over the photodetector 103. See, for example, FIGS. 6A and 6B.

Figure 14:
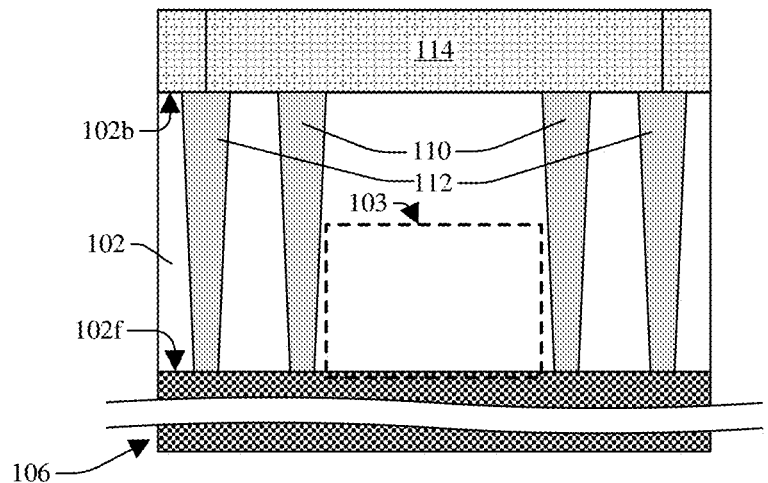

As shown in cross-sectional view 1400 of FIG. 14, a color filter 114 may be formed over the back-side 102b of the substrate 102.

Figure 15:
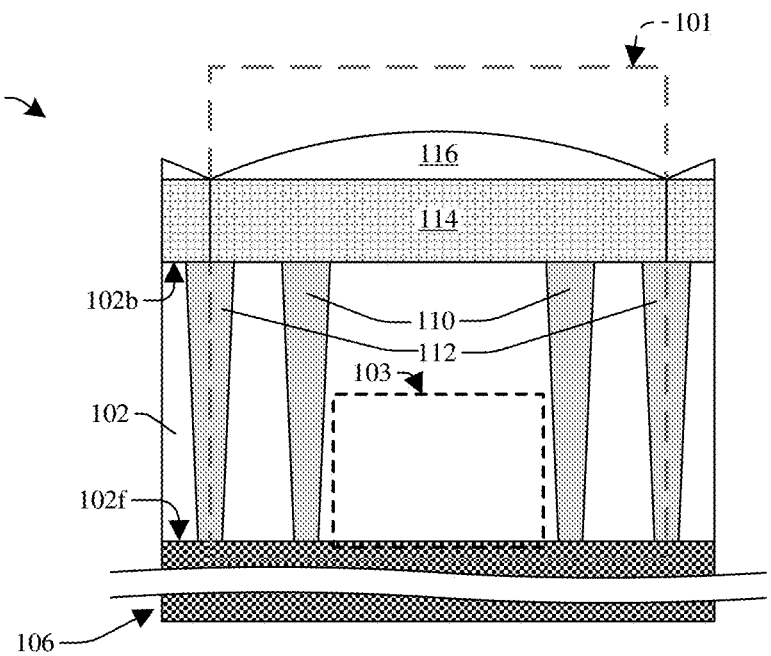

As shown in cross-sectional view 1500 of FIG. 15, a micro-lens 116 may be formed over the color filter 114, though which photons may enter the pixel 101.

By forming first inner trench isolation structure 110 that defines the scattering structure 109 in the image sensor, an angle at which photons (e.g., photons produced by hot-carrier luminescence) impinge on the outer trench isolation structure 112 may be increased. For example, photons that pass though the scattering structure 109 may experience a change in direction. As a result, the photons may impinge on the outer trench isolation structure 112 at an angle that is greater than a critical angle for TIR. Thus, the photons may be reflected back towards the photodetector 103, thereby preventing the photons from exiting the pixel 101 and entering neighboring pixels. As a result, crosstalk between the pixel 101 and neighboring pixels may be reduced, thereby improving a performance of the image sensor.

Further, by forming the first inner trench isolation structure 110 and the outer trench isolation structure 112 in the same step (e.g., with the same deposition process), a complexity, cost, and/or time of forming the image sensor may be minimized.

Figure 16:
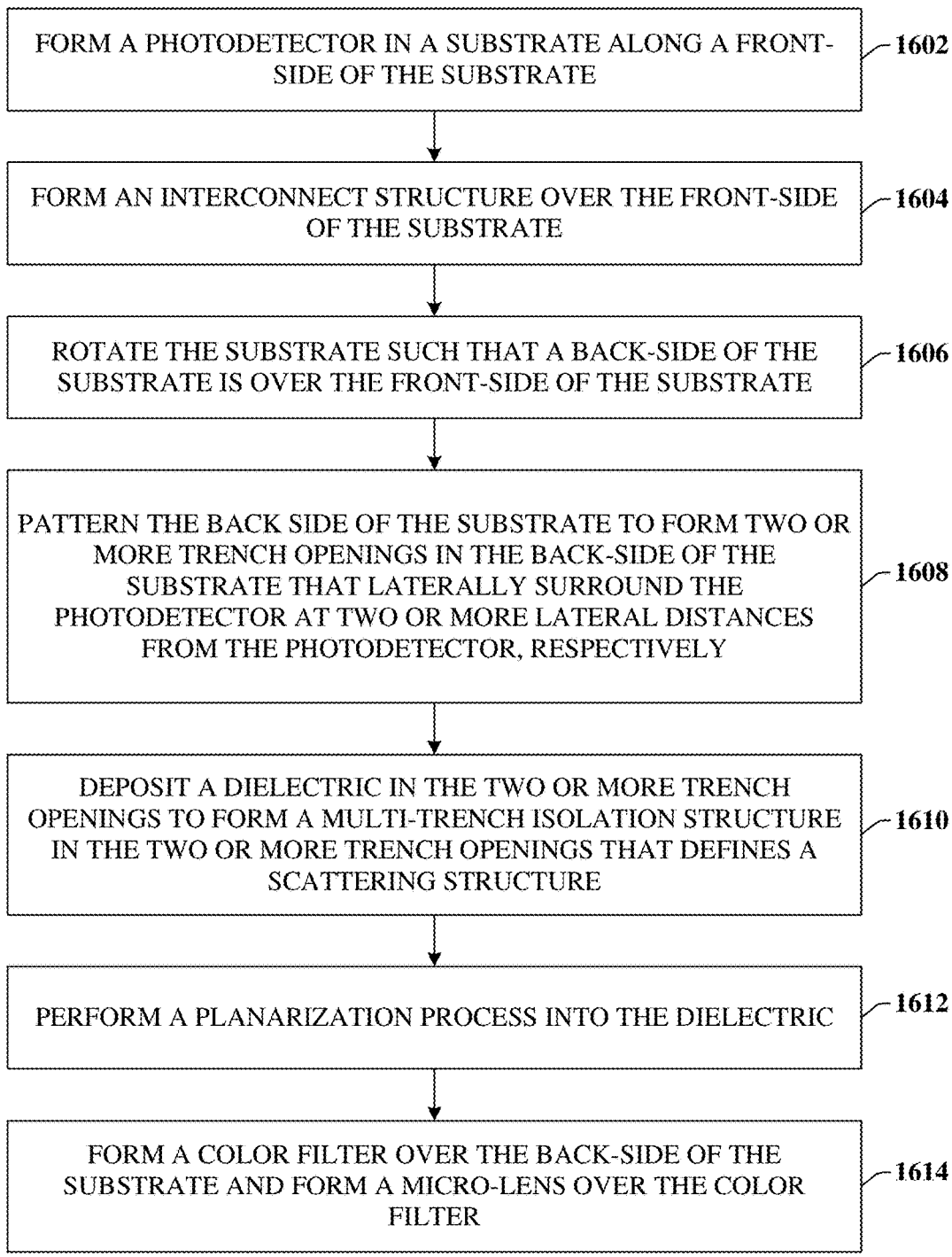
FIG. 16 illustrates a flow diagram of some embodiments of a method for forming an integrated chip including a back-side illuminated (BSI) image sensor, the image sensor including a multi-trench isolation structure that defines a scattering structure.

FIG. 16 illustrates a flow diagram of some embodiments of a method 1600 for forming an integrated chip including a back-side illuminated (BSI) image sensor, the image sensor including a multi-trench isolation structure that defines a scattering structure. While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, a photodetector is formed in a substrate along a front-side of the substrate. FIG. 8 illustrates a cross-sectional view 800 of some embodiments corresponding to act 1602.

At 1604, an interconnect structure is formed over the front-side of the substrate. FIG. 9 illustrates a cross-sectional view 900 of some embodiments corresponding to act 1604.

At 1606, the substrate is rotated such that a back-side of the substrate is over the front-side of the substrate. FIGS. 10A and 10B illustrate a cross-sectional view 1000 and a top layout view 1050 of some embodiments corresponding to act 1606.

At 1608, the back side of the substrate is patterned to form two or more trench openings in the back-side of the substrate that laterally surround the photodetector at two or more lateral distances from the photodetector, respectively. FIGS. 11A and 11B illustrate a cross-sectional view 1100 and a top layout view 1150 of some embodiments corresponding to act 1608.

At 1610, a dielectric is deposited in the two or more trench openings to form a multi-trench isolation structure in the two or more trench openings that defines a scattering structure. FIGS. 12A and 12B illustrate a cross-sectional view 1200 and a top layout view 1250 of some embodiments corresponding to act 1610.

At 1612, a planarization process is performed into the dielectric. FIGS. 13A and 13B illustrate a cross-sectional view 1300 and a top layout view 1350 of some embodiments corresponding to act 1612.

At 1614, a color filter is formed over the back-side of the substrate and a micro-lens is formed over the color filter. FIGS. 14 and 15 illustrate cross-sectional views 1400 and 1500 of some embodiments corresponding to act 1614.

FIGS. 17A and 17B through 20A and 20B and 21-23 illustrate cross-sectional views 1700 and 1750 through 2000 and 2050, 2100-2300 of some embodiments of a method for forming an integrated chip including a front-side illuminated (FSI) image sensor, the image sensor including a multi-trench isolation structure 108 with a scattering structure 109. Figures with a suffix of A correspond to cross-sectional views. Figures with a suffix of B correspond to top layout views for like numbered figures with a suffix of A. Figures without a suffix of A or B correspond to cross-sectional views. Although FIGS. 17A and 17B through 20A and 20B and 21-23 are described in relation to a method, it will be appreciated that the structures disclosed in FIGS. 17A and 17B through 20A and 20B and 21-23 are not limited to such a method, but instead may stand alone as structures independent of the method.

Figure 17A:
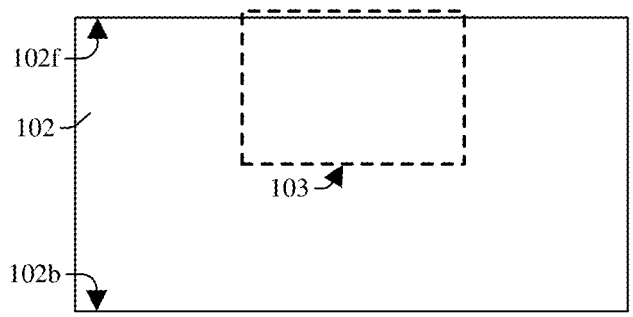
FIGS. 17A, 17B, 18A, 18B, 19A, 19B, 20A, 20B, and 21-23 illustrate cross-sectional views of some embodiments of a method for forming an integrated chip including a front-side illuminated (FSI) image sensor, the image sensor including a multi-trench isolation structure with a scattering structure.
Figure 17B:
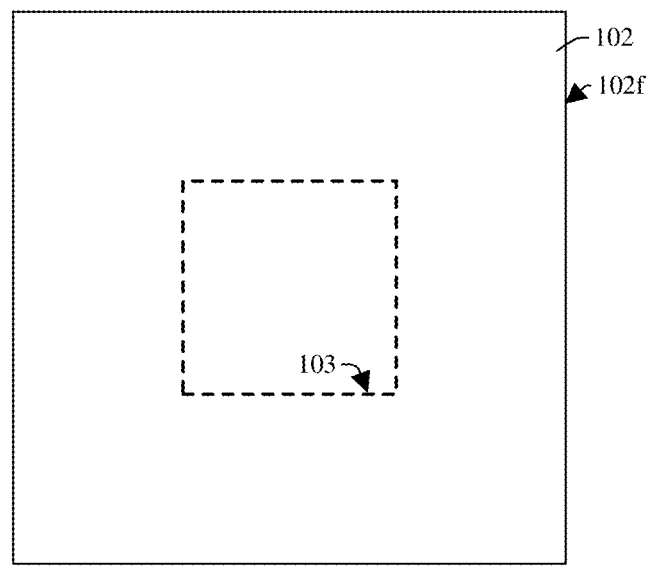

As shown in cross-sectional view 1700 of FIG. 17A and top layout view 1750 of FIG. 17B, a photodetector 103 is formed in a substrate 102 along a front-side 102f of the substrate 102. The photodetector 103 may, for example, be formed through a number of processes such as, for example, ion implantation or the like.

Figure 18A:
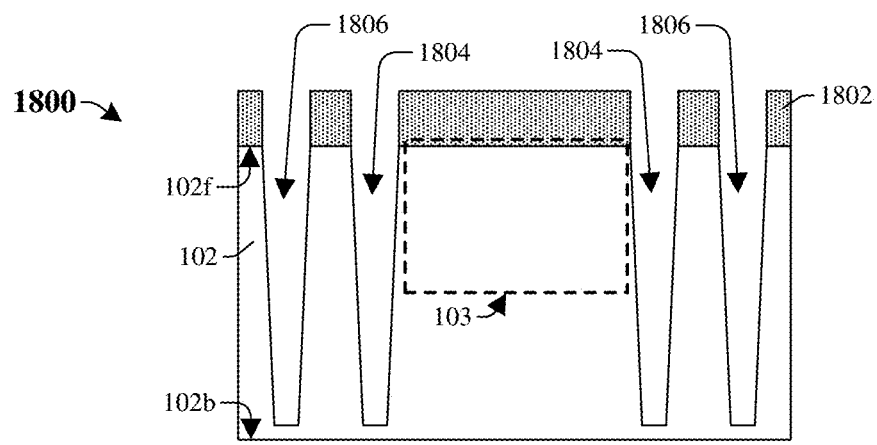
Figure 18B:
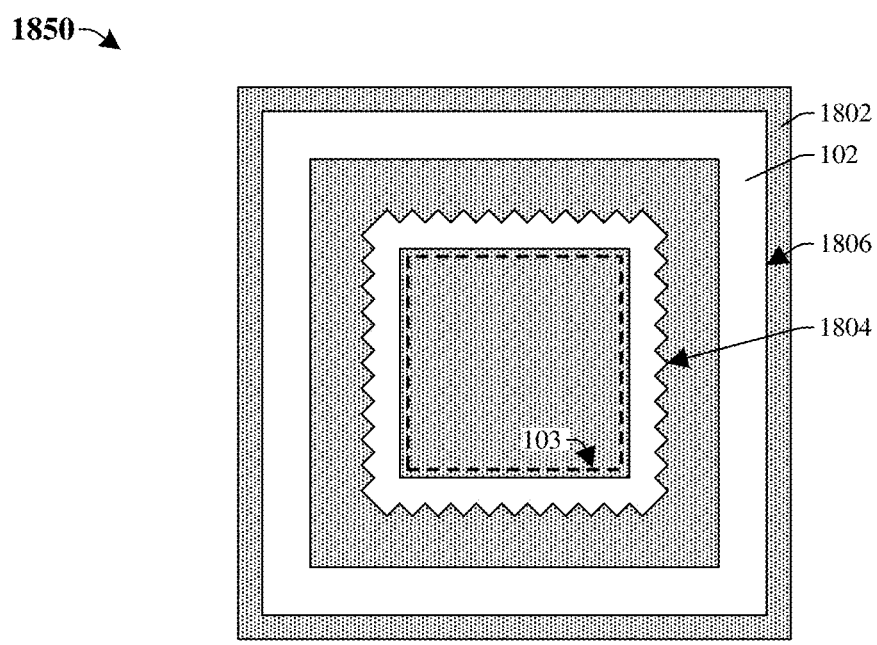

As shown in cross-sectional view 1800 of FIG. 18A and top layout view 1850 of FIG. 18B, a photoresist mask 1802 is formed over the front-side 102f of the substrate 102 and the substrate 102 is patterned with the photoresist mask 1802 in place to form a first inner trench opening 1804 and an outer trench opening 1806 that are defined by sidewalls of the substrate 102. The first inner trench opening 1804 extends into the substrate 102 and laterally surrounds the photodetector 103. The outer trench opening 1806 extends into the substrate 102 and laterally surrounds the first inner trench opening 1804. The patterning may, for example, comprise a wet etching process, a dry etching process, or the like.

In some alternative embodiments, the first inner trench opening 1804 has a top layout as in any one of FIGS. 2A-2E. In some alternative embodiments, the patterning may further form a second inner trench opening (not shown) between the first inner trench opening 1804 and the outer trench opening 1806. In at least some of such alternative embodiments, the first inner trench opening 1804, the outer trench opening 1806, and the second inner trench opening may, for example, have top layouts respectively as the first inner trench isolation structure 110, the outer trench isolation structure 112, and the second inner trench isolation structure 113 in any one of FIGS. 3A, 4A, and 4B.

Figure 19A:
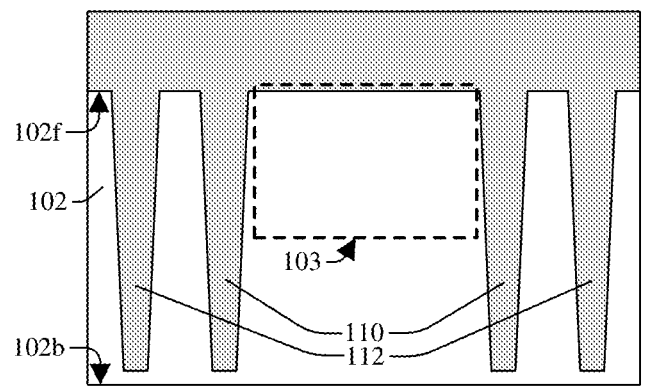
Figure 19B:
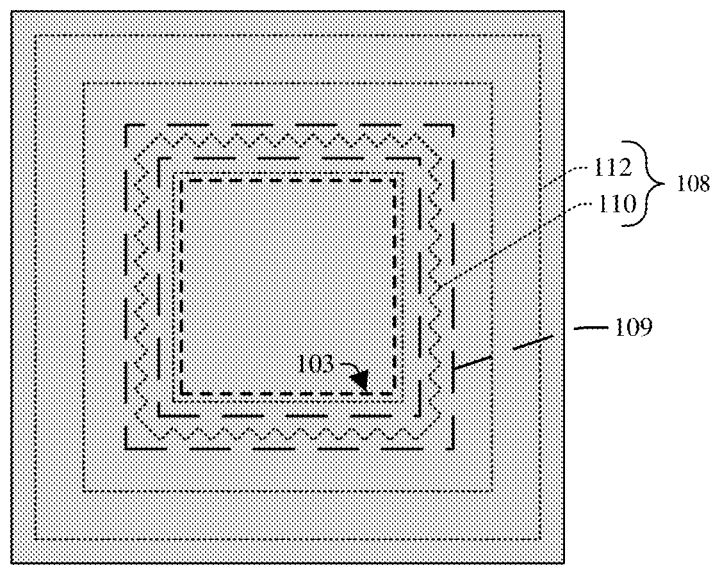

As shown in cross-sectional view 1900 of FIG. 19A and top layout view 1950 of FIG. 19B, a dielectric is deposited over the front-side 102f of the substrate 102, in the first inner trench opening 1804, and in the outer trench opening 1806 to form a multi-trench isolation structure 108. The multi-trench isolation structure 108 comprises a first inner trench isolation structure 110 that defines a scattering structure 109. The first inner trench isolation structure 110 has a plurality of outer sidewalls that are adjacent to sidewalls of the substrate 102 that defined the first inner trench opening 1104. Further, the plurality of outer sidewalls of the first inner trench isolation structure 110 define, at least in part, the scattering structure 109. The multi-trench isolation structure 108 further comprises an outer trench isolation structure 112. The dielectric may, for example, be deposited by CVD, PVD, ALD, a spin-on process, or the like.

In some embodiments, the dielectric may be further deposited in the second inner trench opening (not shown) to form a second inner trench isolation structure between the first inner trench isolation structure 110 and the outer trench isolation structure 112.

Further, in some embodiments, a metal may be deposited in any of the aforementioned trench openings to form a metal layer within any of the aforementioned trench isolation structures. See, for example, FIG. 5. For example, instead of fully filling the first inner and outer trench openings 1804, 1806, the dielectric may be deposited lining and partially filling the first inner and outer trench openings 1804, 1806. The metal may then be deposited filling a remainder of the first inner and outer trench openings 1804, 1806 over the dielectric.

Figure 20A:
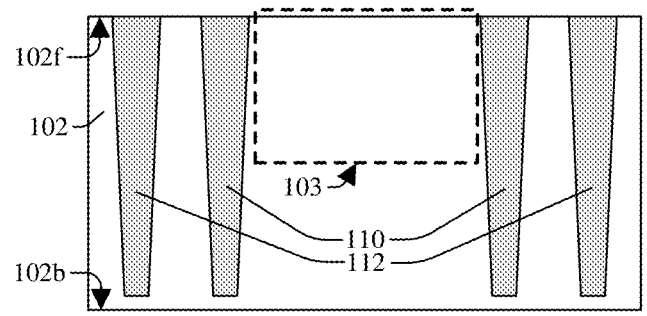
Figure 20B:
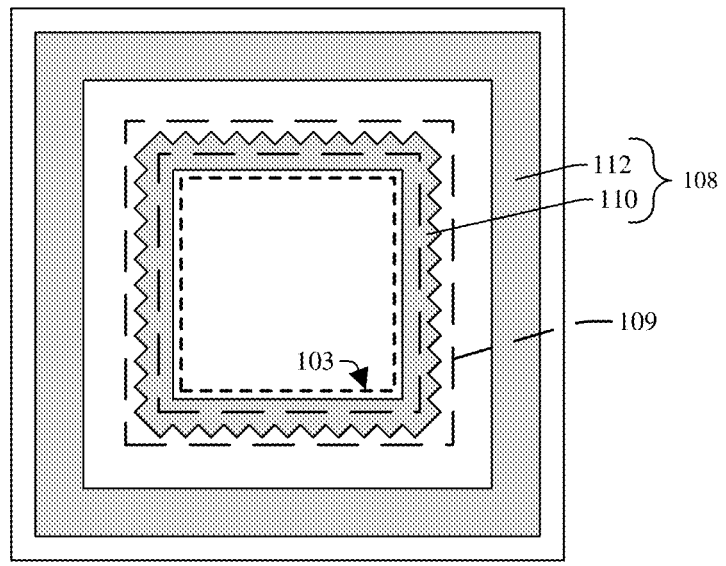

As shown in cross-sectional view 2000 of FIG. 20A and top layout view 2050 of FIG. 20B, a planarization process is performed into the dielectric to remove the dielectric from the front-side 102f of the substrate 102. The planarization process may, for example, comprise a chemical mechanical planarization (CMP) process or the like.

In some embodiments, the planarization process thins the dielectric but does not remove the dielectric from the front-side 102f of the substrate 102, such that the dielectric extends over the photodetector 103. See, for example, FIGS. 6A and 6B.

Figure 21:
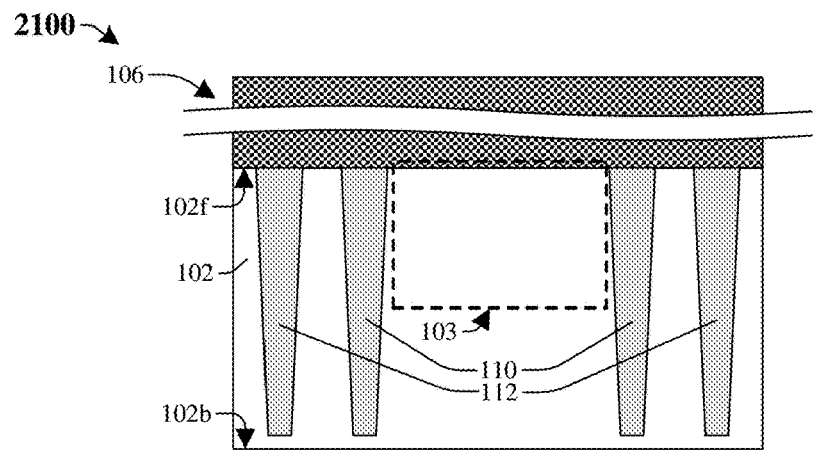

As shown in cross-sectional view 2100 of FIG. 21, an interconnect structure 106 is formed over the photodetector 103 along the front-side 102f of the substrate 102. The interconnect structure 106 may, for example, comprise any of a plurality of interlayer dielectric layers, a plurality of metal lines, and a plurality of vias. The interlayer dielectric layers may, for example, be formed by chemical vapor deposition (CVD), physical vapor deposition (PVD), atomic layer deposition (ALD), a spin on process, or the like. The plurality of metal lines and/or the plurality of vias may, for example, be formed by etching the interlayer dielectric layers with a wet etching process or a dry etching process, and subsequently depositing metal by a sputtering process, an electroplating process, or the like to form the metal lines and/or vias.

Figure 22:
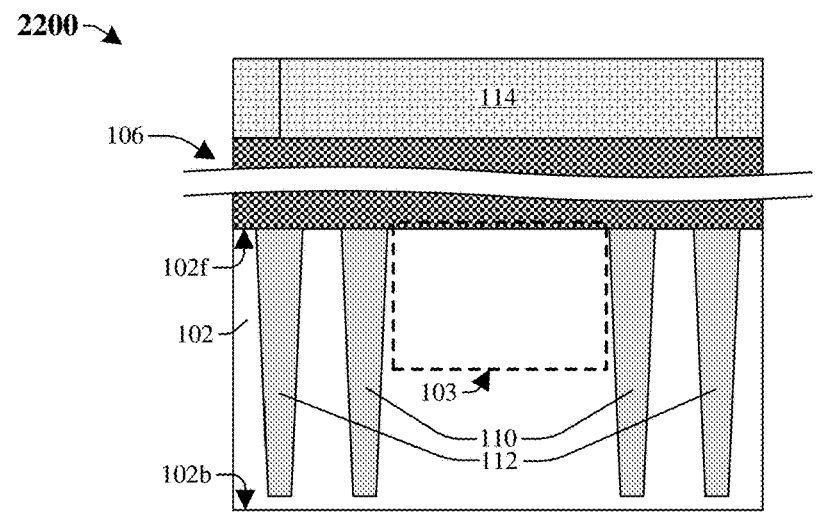

As shown in cross-sectional view 2200 of FIG. 22, a color filter 114 may be formed over the front-side 102f of the substrate 102.

Figure 23:
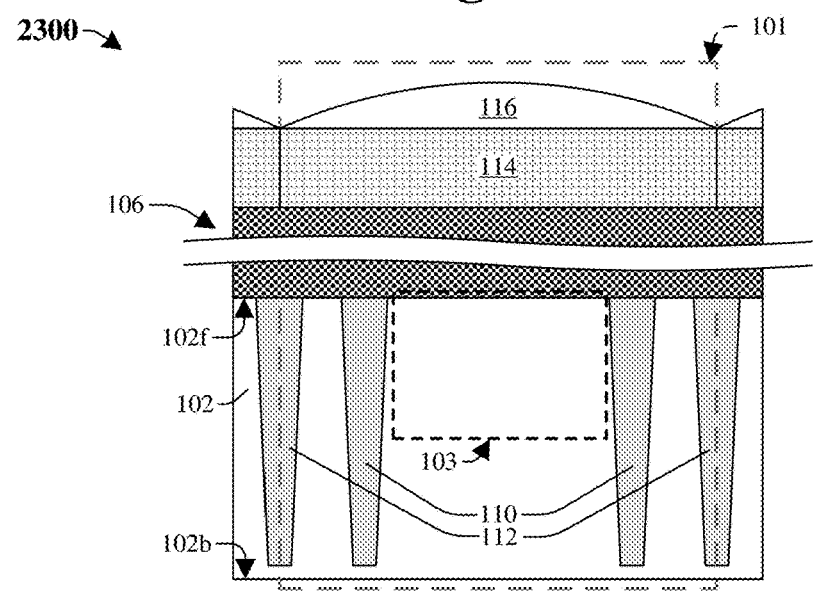

As shown in cross-sectional view 2300 of FIG. 23, a micro-lens 116 may be formed over the color filter 114, through which photons may enter the pixel 101.

Although FIGS. 17A, 17B, 18A, 18B, 19A, 19B, 20A, 20B, and 21-23 illustrate cross-sectional views of some embodiments of a method for forming an integrated chip in which the photodetector 103 is formed before the substrate 102 is patterned to form the first inner trench opening 1804 and the outer trench opening 1806, in some embodiments, the photodetector 103 is formed after the substrate 102 is patterned and before the dielectric is deposited to form the multi-trench isolation structure 108. Further, in some other embodiments, the photodetector 103 is formed after the substrate 102 is patterned and after the dielectric is deposited to form the multi-trench isolation structure 108.

Figure 24:
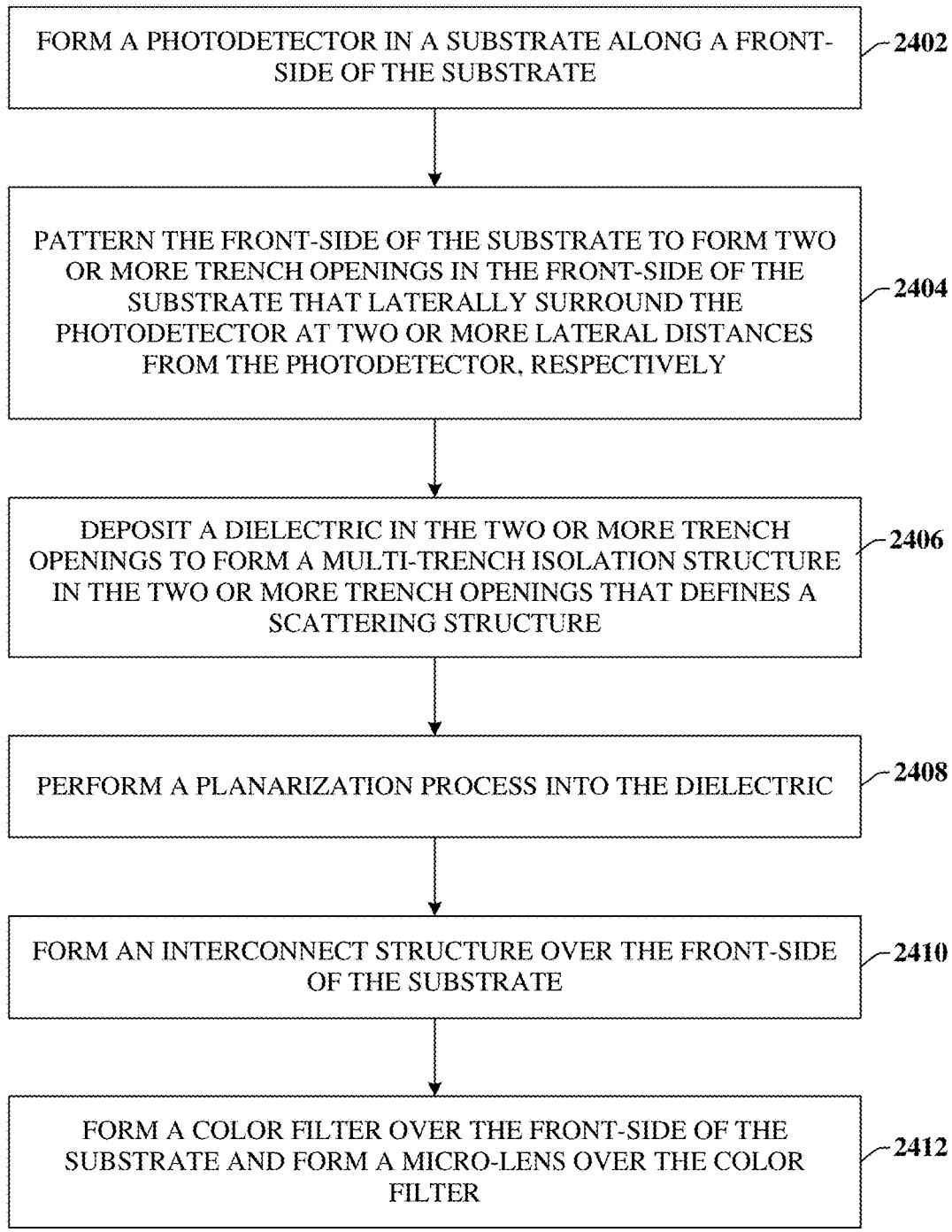
FIG. 24 illustrates a flow diagram of some embodiments of a method for forming an integrated chip including a front-side illuminated (FSI) image sensor, the image sensor including a multi-trench isolation structure that defines a scattering structure.

FIG. 24 illustrates a flow diagram of some embodiments of a method 2400 for forming an integrated chip including a front-side illuminated (FSI) image sensor, the image sensor including a multi-trench isolation structure that defines a scattering structure. While method 2400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2402, a photodetector is formed in a substrate along a front-side of the substrate. FIGS. 17A and 17B illustrate a cross-sectional view 1700 and a top layout view 1750 of some embodiments corresponding to act 2402.

At 2404, the front-side of the substrate is patterned to form two or more trench openings in the front-side of the substrate that laterally surround the photodetector at two or more lateral distances from the photodetector, respectively. FIGS. 18A and 18B illustrate a cross-sectional view 1800 and a top layout view 1850 of some embodiments corresponding to act 2404.

At 2406, a dielectric is deposited in the two or more trench openings to form a multi-trench isolation structure in the two or more trench openings that defines a scattering structure. FIGS. 19A and 19B illustrate a cross-sectional view 1900 and a top layout view 1950 of some embodiments corresponding to act 2406.

At 2408, a planarization process is performed into the dielectric. FIGS. 20A and 20B illustrate a cross-sectional view 2000 and a top layout view 2050 of some embodiments corresponding to act 2408.

At 2410, an interconnect structure is formed over the front-side of the substrate. FIG. 21 illustrates a cross-sectional view 2100 of some embodiments corresponding to act 2410.

At 2412, a color filter is formed over the front-side of the substrate and a micro-lens is formed over the color filter. FIGS. 22 and 23 illustrate cross-sectional views 2200 and 2300 of some embodiments corresponding to act 2412.

Thus, the present disclosure relates to an integrated chip that includes an image sensor, the image sensor comprising a scattering structure that reduces crosstalk and improves performance of the image sensor.

Accordingly, in some embodiments, the present disclosure relates to an integrated chip comprising a substrate and a pixel. The pixel comprises a photodetector. The photodetector is disposed in the substrate. The integrated chip further comprises a first inner trench isolation structure and an outer trench isolation structure that extend into the substrate. The first inner trench isolation structure laterally surrounds the photodetector in a first closed loop. The outer trench isolation structure laterally surrounds the first inner trench isolation structure along a boundary of the pixel in a second closed loop and is laterally separated from the first inner trench isolation structure. Further, the integrated chip comprises a scattering structure that is defined, at least in part, by the first inner trench isolation structure and configured to increase an angle at which radiation impinges on the outer trench isolation structure.

In other embodiments, the present disclosure relates to an image sensor comprising a single-photon avalanche diode (SPAD) disposed in a first side of a semiconductor substrate. The image sensor further comprises a multi-trench isolation structure that extends into the semiconductor substrate. The multi-trench isolation structure comprises a first inner trench isolation structure that extends into the semiconductor substrate and surrounds the SPAD at a first lateral distance from the SPAD. The first inner trench isolation structure has a pair of segments respectively on opposite sides of the SPAD. The multi-trench isolation structure further comprises an outer trench isolation structure that extends into the semiconductor substrate and surrounds the SPAD at a second lateral distance from the SPAD that is greater than the first lateral distance. The outer trench isolation structure has a pair of segments respectively on the opposite sides of the SPAD. Further, a plurality of outer sidewalls of the first inner trench isolation structure have a first periodic pattern and define, at least in part, a scattering structure that is configured to increase an angle at which a photon that has passed through the first inner trench isolation structure impinges on an inner sidewall of the outer trench isolation structure.

In yet other embodiments, the present disclosure relates to a method for forming an image sensor. The method comprises forming a photodetector in a first side of a substrate. The substrate is patterned to form a first inner trench opening and an outer trench opening in the substrate that are defined by sidewalls of the substrate. The first inner trench opening laterally surrounds the photodetector and the outer trench opening laterally surrounds the first inner trench opening. The first inner trench opening is laterally separated from the outer trench opening by the substrate. A dielectric is deposited in the first inner trench opening and the outer trench opening to form a first inner trench isolation structure and an outer trench isolation structure, respectively. The first inner trench isolation structure has a plurality of outer sidewalls adjacent to sidewalls of the substrate that defined the first inner trench opening. The plurality of outer sidewalls define, at least in part, a scattering structure that is configured to increase an angle at which a photon that has passed through the first inner trench isolation structure impinges on the outer trench isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
    forming a pixel along a semiconductor substrate, the pixel including photodetector in a first side of the semiconductor substrate;
    patterning a second side of the semiconductor substrate, opposite the first side, to form both a first inner trench opening and an outer trench opening in the semiconductor substrate, the first inner trench opening laterally surrounding the photodetector and the outer trench opening laterally surrounding the first inner trench opening, wherein the first inner trench opening is laterally separated from the outer trench opening by the semiconductor substrate; and depositing a dielectric in the first inner trench opening and the outer trench opening to form a first inner trench isolation structure and an outer trench isolation structure, respectively, wherein the first inner trench isolation structure has a plurality of outer sidewalls, wherein the plurality of outer sidewalls define, at least in part, a scattering structure, wherein the first inner trench isolation structure is spaced within a boundary of the pixel, and wherein the outer trench isolation structure surrounds the first inner trench isolation structure and the photodetector along the boundary of the pixel to isolate the pixel from neighboring pixels of the image sensor.

2. The method of claim 1, wherein the patterning of the second side of the semiconductor substrate further forms a second inner trench isolation opening in the semiconductor substrate that laterally surrounds the first inner trench opening and that is laterally surrounded by the outer trench opening, and wherein the dielectric is deposited in the second inner trench isolation opening to form a second inner trench isolation structure.

3. The method of claim 1, wherein the patterning comprises forming a masking layer over the second side of the semiconductor substrate and etching the second side of the semiconductor substrate with the masking layer in place to form both the first inner trench opening and the outer trench opening in the semiconductor substrate.

4. The method of claim 1, wherein the first inner trench isolation structure extends continuously in a first closed path, wherein the outer trench isolation structure extends continuously in a second closed path different than the first closed path, and wherein the boundary of the pixel extends in the second closed path.

5. The method of claim 1, wherein the plurality of outer sidewalls of the first inner trench isolation structure are directly between an inner sidewall of the first inner trench isolation structure and a sidewall of the outer trench isolation structure.

6. The method of claim 1, wherein the first inner trench opening is formed by a first sidewall and a plurality of second sidewalls of the semiconductor substrate, wherein the outer trench opening is formed by a third sidewall of the semiconductor substrate, wherein the plurality of second sidewalls are directly between the first sidewall and the third sidewall, and wherein the plurality of outer sidewalls of the first inner trench isolation structure are adjacent to the plurality of second sidewalls of the semiconductor substrate that form the first inner trench opening.

7. The method of claim 1, wherein the first inner trench opening is formed by a first sidewall of the semiconductor substrate that faces away from the photodetector, a second sidewall of the semiconductor substrate that faces toward the photodetector, and a third sidewall of the semiconductor substrate that faces toward the photodetector, wherein the outer trench opening is formed by a fourth sidewall of the semiconductor substrate, wherein the second sidewall and the third sidewall are directly between the first sidewall and the fourth sidewall, and wherein a distance between the first sidewall and the second sidewall is different than a distance between the first sidewall and the third sidewall.

8. The method of claim 1, wherein the scattering structure is configured to change a direction of travel of photons passing through the scattering structure, wherein the outer trench isolation structure is configured to reflect at least a portion of the photons which passed through the scattering structure back toward the photodetector to prevent the portion of the photons from exiting the pixel and entering the neighboring pixels.

9. The method of claim 1, wherein the first inner trench isolation structure and the outer trench isolation structure are directly between the photodetector and the neighboring pixels to isolate the photodetector from the neighboring pixels.

10. A method for forming an image sensor, the method comprising:

forming a photodetector along a first side of a semiconductor substrate;

etching the semiconductor substrate to form a first inner trench opening and an outer trench opening in the semiconductor substrate, the first inner trench opening laterally surrounding the photodetector, the outer trench opening laterally surrounding the first inner trench opening, wherein the first inner trench opening is partially delimited by a first sidewall of the semiconductor substrate that faces away from the photodetector and by a plurality of second sidewalls of the semiconductor substrate that face toward the photodetector, wherein the outer trench opening is partially delimited by a third sidewall of the semiconductor substrate that faces away from the photodetector, and wherein the plurality of second sidewalls are directly between the first sidewall and the third sidewall; and depositing a dielectric in the first inner trench opening and the outer trench opening to form a first inner trench isolation structure in the first inner trench opening and to form an outer trench isolation structure in the outer trench opening, wherein the first inner trench isolation structure has an inner sidewall bordering the first sidewall of the semiconductor substrate and a plurality of outer sidewalls bordering the plurality of second sidewalls of the semiconductor substrate, respectively, wherein the outer trench isolation structure has a sidewall bordering the third sidewall of the semiconductor substrate, and wherein the plurality of outer sidewalls of the first inner trench isolation structure partially define a scattering structure.

11. The method of claim 10, wherein the plurality of outer sidewalls of the first inner trench isolation structure are directly between the inner sidewall of the first inner trench isolation structure and the sidewall of the outer trench isolation structure.

12. The method of claim 10, further comprising:

etching the semiconductor substrate to form a second inner trench opening in the semiconductor substrate between the first inner trench opening and the outer trench opening; and depositing the dielectric in the second inner trench opening to form a second inner trench isolation structure in the second inner trench opening.

13. The method of claim 12, wherein the second inner trench opening is partially delimited by a fourth sidewall of the semiconductor substrate that faces away from the photodetector and by a plurality of fifth sidewalls of the semiconductor substrate that face toward the photodetector, wherein the fourth sidewall of the semiconductor substrate is directly between the plurality of second sidewalls of the semiconductor substrate and the third sidewall of the semiconductor substrate, wherein the plurality of fifth sidewalls of the semiconductor substrate are spaced from the plurality of second sidewalls of the semiconductor substrate and directly between the fourth sidewall of the semiconductor substrate and the third sidewall of the semiconductor substrate, and wherein the plurality of fifth sidewalls of the semiconductor substrate are directly between the first sidewall of the semiconductor substrate and the third sidewall of the semiconductor substrate.

14. The method of claim 13, wherein a distance between the first sidewall of the semiconductor substrate and one of the plurality of second sidewalls of the semiconductor substrate is less than a distance between the fourth sidewall of the semiconductor substrate and one of the plurality of fifth sidewalls of the semiconductor substrate.

15. The method of claim 10, wherein the etching is performed into a second side of the semiconductor substrate opposite the first side.

16. A method for forming an image sensor, the method comprising:
    forming a photodetector along a first side of a semiconductor substrate;
    etching the semiconductor substrate to form a first inner trench opening, a second inner trench opening, and an outer trench opening in the semiconductor substrate, the first inner trench opening laterally surrounding the photodetector and formed by a first sidewall of the semiconductor substrate that faces away from the photodetector and a plurality of second sidewalls of the semiconductor substrate that face toward the photodetector, the second inner trench opening laterally surrounding the first inner trench opening and formed by a plurality of third sidewalls of the semiconductor substrate that face toward the photodetector, and the outer trench opening laterally surrounding the second inner trench opening and formed by a fourth sidewall of the semiconductor substrate that faces away from the photodetector, wherein the plurality of second sidewalls and the plurality of third sidewalls are directly between and spaced from the first sidewall and the fourth sidewall, wherein the first inner trench opening is laterally separated from the second inner trench opening by the semiconductor substrate, and wherein the second inner trench opening is laterally separated from the outer trench opening by the semiconductor substrate; and
    depositing a dielectric in the first inner trench opening, the second inner trench opening, and the outer trench opening to form a first inner trench isolation structure in the first inner trench opening, a second inner trench isolation structure in the second inner trench opening, and an outer trench isolation structure in the outer trench opening, wherein the first inner trench isolation structure and the second inner trench isolation structure define, at least in part, a scattering structure.

17. The method of claim 16, wherein the etching extends into the semiconductor substrate from a second side of the semiconductor substrate, opposite the first side, to form the first inner trench opening, the second inner trench opening, and the outer trench opening together.

18. The method of claim 17, wherein the dielectric is deposited in the first inner trench opening, the second inner trench opening, the outer trench opening, and extends over the second side of the semiconductor substrate.

19. The method of claim 16, wherein the first inner trench isolation structure has a plurality of outer sidewalls forming a plurality of protrusions that protrude outward from the first inner trench isolation structure towards a sidewall of the outer trench isolation structure, and wherein the plurality of protrusions are spaced from the sidewall of the outer trench isolation structure.

20. The method of claim 16, wherein a width of the first inner trench isolation structure is greater along a second side of the semiconductor substrate, opposite the first side, than along the first side of the semiconductor substrate, and wherein a width of the outer trench isolation structure is greater along the second side of the semiconductor substrate than along the first side of the semiconductor substrate.

* * * * *